United States Patent [19]

Cameron et al.

[11] 3,998,674
[45] Dec. 21, 1976

[54] METHOD FOR FORMING RECESSED REGIONS OF THERMALLY OXIDIZED SILICON AND STRUCTURES THEREOF UTILIZING ANISOTROPIC ETCHING

[75] Inventors: Donald P. Cameron; Paul J. Tsang, both of Poughkeepsie, N.Y.

[73] Assignee: International Business Machines Corporation, Armonk, N.Y.

[22] Filed: Nov. 24, 1975

[21] Appl. No.: 634,571

[52] U.S. Cl. .............................. 148/175; 29/578; 29/580; 148/1.5; 156/17; 156/612; 357/50; 357/60
[51] Int. Cl.² .................. H01L 21/76; H01L 21/20
[58] Field of Search ............ 148/1.5, 175; 157/17, 157/612; 29/578, 580; 357/50, 60

[56] References Cited
UNITED STATES PATENTS

| | | | |
|---|---|---|---|
| 3,728,166 | 4/1973 | Bardell et al. ..................... | 148/175 |
| 3,752,714 | 8/1973 | Ito et al. ............................ | 148/175 |
| 3,765,969 | 10/1973 | Kragness et al. .................. | 156/17 |
| 3,810,796 | 5/1974 | Skaggs et al. ..................... | 156/17 X |
| 3,813,585 | 5/1974 | Tarvi et al. ........................ | 357/60 |
| 3,832,225 | 8/1974 | Matsui et al. ..................... | 156/17 X |
| 3,883,948 | 5/1975 | Allison ............................. | 29/580 X |

OTHER PUBLICATIONS

Ligenza; J. R., "Effect of Crystal Orientation . . . Oxidation . . . Steam," J. Phys. Chem., vol. 65, Nov. 1961, pp. 2011–2014.
Lee; D. B., "Anisotropic Etching of Silicon," J. Applied Physics, vol. 40, No. 11, Oct. 1969, pp. 4569–4574.
Leone et al., "Fabricating Shaped Grid and Aperture Holes," I.B.M. Tech. Discl. Bull., vol. 14, No. 2, July 1971, pp. 417–418.
Appels et al., "Local Oxidation of Silicon: New Technological Aspects," Philips Research Reports, vol. 26, No. 3, June 1971, pp. 157–165.

Primary Examiner—L. Dewayne Rutledge
Assistant Examiner—W. G. Saba
Attorney, Agent, or Firm—Wolmar J. Stoffel

[57] ABSTRACT

An improved method for forming a recessed thermal $SiO_2$ isolation region in a monocrystalline silicon semiconductor body having a major surface lying in a (100) plane as defined by the Miller indices by forming an etch resistant and oxidation resistant masking layer on the major surface of the body, forming at least one rectilinear annular opening in the masking layer, the opening being oriented with the sides parallel to the [100] directions on the major surface, removing a portion of the exposed body by anisotropic chemical etching, and oxidizing the resultant exposed portions of the body until the surface of the resultant $SiO_2$ and major surface are substantially coplanar.

A semiconductor device including a silicon substrate of a first conductivity, the major surface being in the (100) plane, an epitaxial silicon layer on the substrate, a lateral PN junction in the substrate, at least one annular rectangular shaped recessed $SiO_2$ region in the epitaxial layer extending inwardly to the PN junction, the annular region being oriented with the sides parallel to the [100] direction on the major surface.

6 Claims, 8 Drawing Figures

METHOD FOR FORMING RECESSED REGIONS OF THERMALLY OXIDIZED SILICON AND STRUCTURES THEREOF UTILIZING ANISOTROPIC ETCHING

BACKGROUND OF THE INVENTION

The invention relates to dielectrically isolated semiconductor devices which are particularly adapted to form a part of the integrated circuit, more particularly to an improved structure and an improved method for forming recessed thermal SiO₂ isolation regions in a monocrystalline silicon semiconductor body.

DESCRIPTION OF THE PRIOR ART

Semiconductor devices of the integrated circuit type are fabricated universally from relatively thin slices of monocrystalline semiconductor material. Each slice in processing undergoes a relatively large number of process steps wherein isolation structure is provided to isolate regions, diffusions are made to the regions to form active and passive devices, a passivating layer deposited, and a metallurgy formed to interconnect the various devices. Normally, the wafer contains a large number of integrated circuit devices which are electrically isolated.

In the fabrication of integrated circuit semiconductor devices, particularly utilizing bipolar transistors, it is necessary to provide electrical isolation between the various individual active and passive devices of the circuit within the semiconductor body. This can be achieved a number of ways, as for example by junction isolation, by etching slots between the elements, or by forming regions of dielectric material that extend into the body where it meets a laterally extending PN junction. Techniques for forming recessed dielectrically isolated semiconductor devices are disclosed and claimed in application Ser. No. 150,609 filed June 7, 1971 and entitled "Dielectric Isolation for High Density Semiconductor Devices". The basic concept is also disclosed in U.S. Pat. No. 3,648,125 entitled "Method of Fabricating Integrated Circuits with Oxidized Isolation and the Resultant Structure".

In recessed oxide isolated device structures of the type described in the two aforementioned references, an important consideration is the planarity of the surface of the devices. Planarity is important because the smoother the surface the less difficulty and uncertainty is encountered in forming effective passivating dielectric layers and continuous metallurgy stripes. Ridges or depressions on the surface may prevent the formation of impervious and continuous dielectric and metallic layers. These layers may have breaks over the ridges or depressions. Further, nonplanarity may cause resist exposure problems in fabricating the metallurgy interconnection systems.

Another important consideration is the shape of the sidewalls of the recessed oxide regions. Desirably, the sidewalls should be as near to vertical, i.e. transverse to the top surface, as possible. The achievement of this objective minimizes the area required for isolation structure, and also results in more effective and efficient PN junction abutting.

In fabricating recessed oxide isolation device structures, the semiconductor body, usually including an epitaxial layer on a monocrystalline silicon wafer, is covered with an oxidation resistant masking layer. Openings defining the location of the desired recessed oxide region are formed, and a portion of the silicon removed. The body is then exposed to an oxidizing atmosphere, as for example steam at 900° to 1100° C, to oxidize the exposed silicon for a time sufficient to form the regions to the desired depth. When the proper amount of silicon is removed, the top surface of the resultant SiO₂ regions is at the same level as the surface of the body. While the process is relatively simple in principle, the resultant top surface is not completely planar. A typical top surface configuration is illustrated in FIG. 6 of the drawings. As indicated, a ridge 40 is formed on the oxide that is parallel to the edge of the masking layer 22. Closely adjacent and parallel to the ridge 40 is a depression or trench 42. Also, there is a formation of oxide that extends under the masking layer which when viewed in cross-section resembles the beak of a bird. This oxide formation at the interface of the body and masking layer affects the thickness and uniformity of the layer which introduces processing difficulties. The aforementioned irregularity of the wafer surface thus is responsible for the difficulties discussed previously. In addition, the trench or depression that forms between the crown or ridge is a potential trap for ionic species. The sidewalls of the recessed oxide region are slanted as compared to the oxide regions of FIG. 7, produced in accordance with the method of the invention. Consequently, the regions with slanted sidewalls require more space. Also, PN junctions when abutted on a slanted oxide sidewall are not as dependable as junctions abutting more vertical sidewalls.

Thus, there exists in the semiconductor technology a need for reducing the surface irregularities in recessed oxide isolation techniques.

SUMMARY OF THE INVENTION

An object of this invention is to provide a method for reducing the surface irregularities in device structures fabricated by recessed oxide isolation technology.

Another object of this invention is to provide a method for achieving, in a semiconductor device, recessed oxide sidewalls that are more nearly vertical.

Another object of this invention is to provide an improved semiconductor device wherein the device embodies recessed oxide isolation regions having minimum surface irregularities and improved sidewall interface surfaces.

In accordance with the aforementioned objects, there is presented an improved method for forming recessed thermal SiO₂ isolation regions in a monocrystalline silicon semiconductor body having a major surface lying in the (100) plane, as defined by the Miller indices, wherein an etch resistant and oxidation resistant masking layer is formed on the major surface of the body, at least one rectilinear annular opening in the masking layer is formed, the opening being oriented with the sides parallel to the [100] directions on the major surface, removing a portion of the exposed body by anisotropic chemical etching, and oxidizing resultant exposed portions of the body until the surface of the resultant SiO₂ and major surface are substantially coplanar, and the sidewalls are substantially vertical.

The invention also encompasses an improved semiconductor device which includes a silicon substrate of a first conductivity, the major surface being in the (100) plane, an epitaxial silicon layer on the substrate, a lateral PN junction in the device, and at least one annular rectangular shaped recessed oxide region in the epitaxial layer extending inwardly to the PN junction, the annular region aligned with its sides parallel to the [100] directions.

DESCRIPTION OF THE PREFERRED EMBODIMENTS

Figure 1:
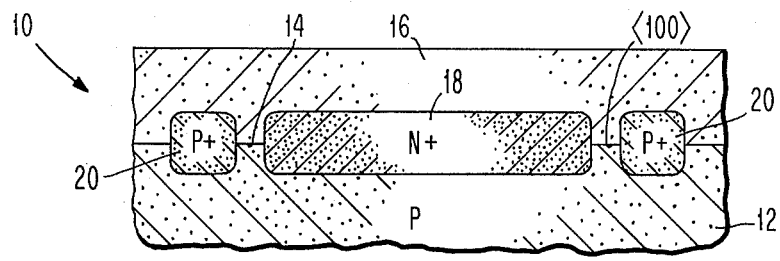
FIGS. 1, 2, 3 and 4 are a sequence of elevational views in broken section illustrating the method of fabricating the improved recessed oxide isolation structure of the invention.
Figure 2:
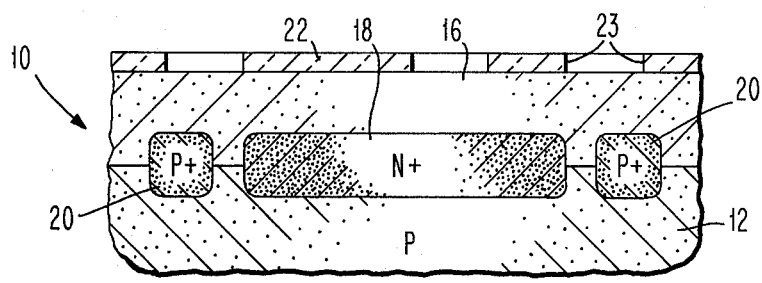
Figure 2A:
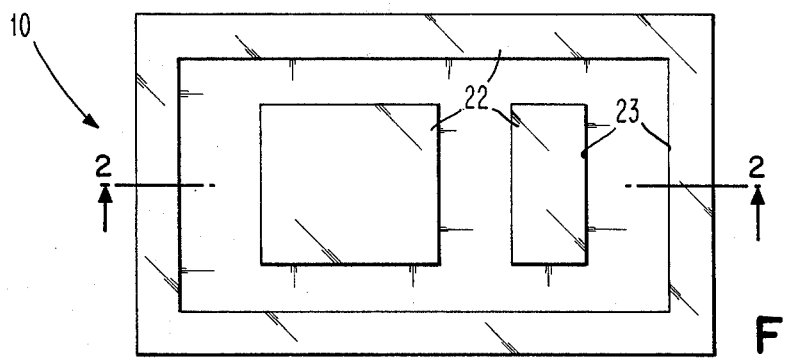
FIG. 2A is a top plan view of the structure illustrated in FIG. 2.
Figure 5:
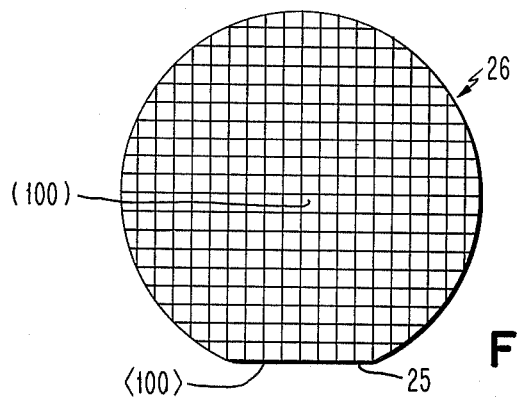
FIG. 5 is a top plan view of a semiconductor wafer utilizing the present method and showing the orientation of the major surfaces and the flat of the wafer.

Referring now to the figures in the drawings, and to FIG. 1 in particular, there is illustrated the silicon monocrystalline semiconductor body 10 which serves as a starting structure for the method of the invention. Body 10 will conventionally consist of a monocrystalline wafer 12 embodying a dopant. The top surface 14 is parallel to the (100) crystalline plane as defined by the Miller indices. The description for defining crystalline planes, and the symbols used in the Miller indices terminology are contained in "Elements of X-Ray Diffraction" by B. D. Cullity, Addison-Wesley, 1956, pages 37–42. An epitaxial layer 16 of silicon is grown on the wafer 12 using conventional epitaxial deposition techniques. When the isolation structure of the invention is to be applied to bipolar type devices, a suitable mask is formed on the wafer 12 prior to epitaxial deposition, and windows made therein for forming the diffusions which will ultimately be the high conductivity sub-collector region 18. It is also desirable to form high conductivity diffusions in wafer 12 to form the regions 20 which will underlie the recessed oxide isolation regions to be formed. Regions 20 are of the same conductivity type as the impurity in wafer 12. A masking layer 22 is formed on the top surface of epitaxial layer 16 as shown in FIG. 2. The top surface of epitaxial layer 16 will be considered the major surface of body 10 which is also in a plane parallel to the (100) plane. Openings are then formed in masking layer 22 as shown in FIG. 2A. In forming an integrated circuit semiconductor device, the openings in layer 22 define the locations of recessed oxide regions which will later be formed in the body 10. In general, the openings have a grid-like configuration forming generally annular rectangular shapes. A critical requirement in practicing the method of this invention is to align the rectilinear axis of the annular rectangular mask openings with the line defined by the intersections of the (100) plane, i.e. the major surface, and the other {100} planes of the silicon substrate. Another way of defining this relationship is to align the sides of the rectangular mask openings such that they are parallel with the [100] directions on (100) plane. A convenient method for making this alignment is shown in FIG. 5 where a flat surface 25 parallel to the [100] direction of the silicon substrate is machined on wafer 26 and the grid pattern aligned parallel to the flat surface 25 is formed in the masking layer by conventional photolithographic and subtractive etching techniques known to the art.

Figure 3:
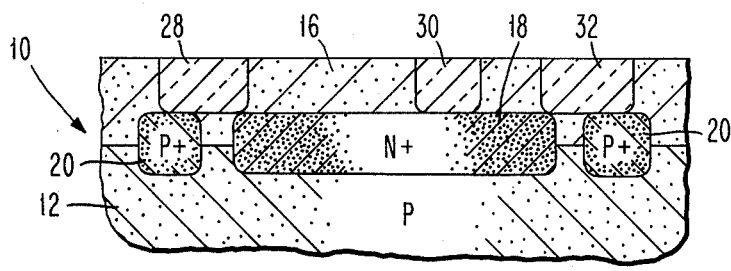

The masking layer 22 must be oxidation resistant. This layer is most conveniently a composite layer consisting of a lower layer of $SiO_2$ formed by thermal techniques on the major surface of body 10 with an overlying layer of $Si_3N_4$ deposited thereon. After the openings 23 have been formed in layer 22 with the aforedescribed orientation, a portion of the silicon exposed to the openings is removed by anisotropic subtractive etching. The amount or depth that the silicon is removed through openings 23 depends on the desired depth of penetration of the oxide regions to be formed. In general, the silicon is removed to approximately 40 percent of the desired depth of the recessed oxide regions. The body 10 is then exposed to an oxidizing environment, as for example steam at 900° to 1100° C which oxidizes the exposed silicon forming recessed oxide regions 28, 30 and 32 as indicated in FIG. 3.

Figure 4:
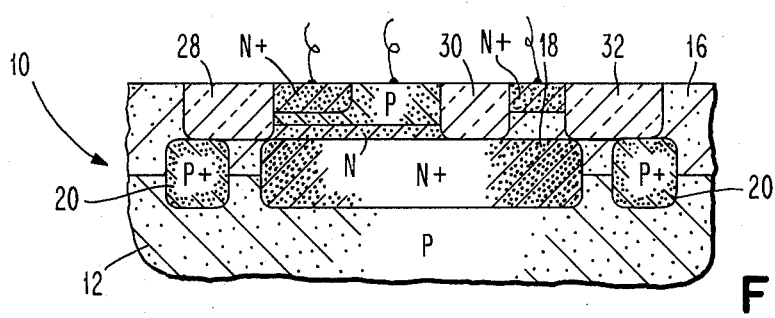

In removing the silicon from the body prior to oxidation an anisotropic etch is used. A typical etch for anisotropic etching is 0.5N KOH ethanol solution. Following the oxidation, the masking layer 22 is stripped and the desired device structure, as for example base, emitter and collector contacts, made using conventional masking, diffusion and/or ion implantation techniques. The resultant structure is illustrated in FIG. 4.

It is to be understood that the improved recessed oxide isolation structure of the invention is not restricted to forming bipolar transistors. The method could be used to form any type of structure, as for example insulating field effect transistors, complementary MOS applications, and the like.

Figure 6:
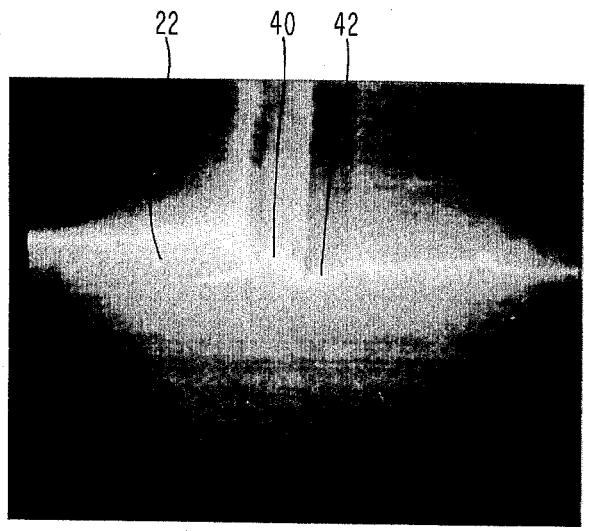
FIG. 6 is a scanning electron micrograph of a fractured cross section of a semiconductor illustrating the recessed oxide isolation structure and the resultant surface irregularities as produced by techniques known in the prior art.

Referring now to FIG. 6, there is illustrated a cross-section of the recessed oxide isolation region having a thickness of approximately 9000 Angstroms which was formed on a (100) wafer with the edge of the device region aligned with the [110] orientations. The structure has been discussed previously in the discussion of the prior art. However, note that there is a very pronounced ridge 40 extending parallel to a depression or trench 42. Also note that the oxide formation extends along the interface of the body and the masking layer 22.

Figure 7:
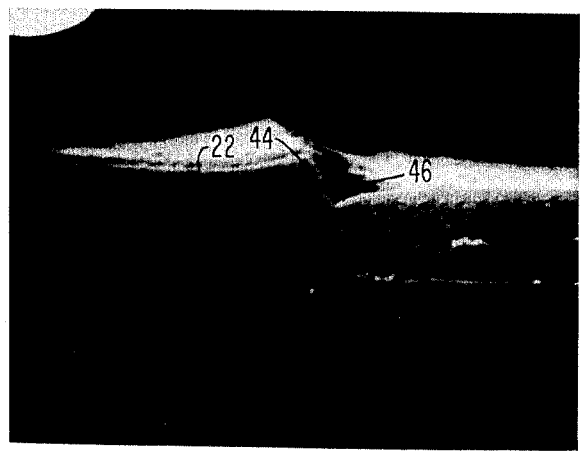
FIG. 7 is a scanning electron micrograph of a fractured cross section of a semiconductor device illustrating the structure of the recessed oxide isolation of the invention and the resultant top surface.

Referring now to FIG. 7, there is illustrated a cross-sectional view of a recessed oxide isolation structure made in accordance with the invention. This oxide region is also approximately 9000 Angstroms in thickness and also formed on the (100) major plane of a wafer. However, the edge of the mask opening was aligned with the [100] orientations, i.e. the intersection of (100) surface plane and the other {100} planes of the silicon substrate. This is in accordance with the teachings of the invention. Comparing the cross-sectional view shown in FIG. 6 with that of FIG. 7, note that the corresponding ridge 44 and depression 46 are much less pronounced than ridge 40 and trench 42 as in FIG. 6. Also note that the oxide does not extend as far underneath the masking layer 22 in FIG. 7.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. An improved method for forming a recessed thermal $SiO_2$ isolation region in a monocrystalline silicon semiconductor body having a major surface lying in a (100) plane, as defined by the Miller indices, comprising forming an etch resistant and oxidation resistant masking layer on said major surface of said body, forming at least one rectilinear annular opening in said masking layer, said opening being oriented with the sides parallel to the [100] directions on said major surface, removing a portion of the exposed body by anisotropic chemical etching, oxidizing the resultant exposed portions of said body until the surface of the resultant $SiO_2$ and major surface are substantially co-planar.

2. The method of claim 1 wherein said anisotropic etch is a solution of 0.5N KOH ethanol.

3. The method of claim 1 wherein the thickness of silicon removed by the anisotropic etch is approximately 40 percent the depth of the ultimate recessed oxide regions.

4. The method of claim 1 wherein said masking layer is a composite layer comprised of a lower layer of $SiO_2$ and an overlying layer of $Si_3N_4$.

5. The method of claim 1 wherein said semiconductor body is comprised of a monocrystalline silicon substrate and an epitaxial layer of silicon.

6. The method of claim 5 wherein said body includes a generally laterally disposed PN junction, and said oxidizing of the silicon is maintained until the resultant $SiO_2$ regions intersect the junction.

* * * * *